(12) United States Patent
Vilkov et al.

(10) Patent No.: US 6,366,995 B1
(45) Date of Patent: Apr. 2, 2002

(54) SYSTEM AND A METHOD FOR DEFINING TRANSFORMS OF MEMORY DEVICE ADDRESSES

(75) Inventors: Boris Nikolaevich Vilkov, St. Petersburg (RU); Alexander Roger Deas, Edinburgh (GB)

(73) Assignee: Acuid Corporation Limited, Guernsey (GB)

( * ) Notice: Subject to any disclaimer, the term of this patent is extended or adjusted under 35 U.S.C. 154(b) by 0 days.

(21) Appl. No.: 09/377,172

(22) Filed: Aug. 19, 1999

(30) Foreign Application Priority Data

Aug. 19, 1998 (RU) ............... PCT/RU/98/00275

(51) Int. Cl.[7] .............................. G06F 12/00
(52) U.S. Cl. ...................... 711/206; 714/718
(58) Field of Search ................ 711/202, 203, 711/206; 714/718

(56) References Cited

U.S. PATENT DOCUMENTS 4,774,652 A * 9/1988 Dhuey et al. ............... 364/200
5,455,775 A * 10/1995 Huber et al. ................ 364/488
5,485,474 A    1/1996 Rabin
5,720,031 A * 2/1998 Lindsay ................ 395/183.18

FOREIGN PATENT DOCUMENTS

EP          824-237 A2    2/1998
WO        WO 99/37083  *  7/1999

OTHER PUBLICATIONS

Nik Kirschner, An Interactive Descrambler Program for RAMS with Redundancy, Nov. 15–18, 1982, pp. 252–257.

* cited by examiner

Primary Examiner—Kevin Verbrugge
(74) Attorney, Agent, or Firm—Wenderoth, Lind & Ponack, L.L.P.

(57) ABSTRACT

A system, a method and a computer program product for defining transforms of cell addresses between different memory device topologies providing the use of minimum memory space and time required for storage and computing defect data and also the flexibility of approach offering a user friendly interface and simplification of the transformation procedure.

15 Claims, 3 Drawing Sheets a)

b)

c)

When X invertible,
$M = Y \cdot (X)^{-1}$ transposed X:

Error ⟷ $Y_k = 0$, $k > n$

SYSTEM AND A METHOD FOR DEFINING TRANSFORMS OF MEMORY DEVICE ADDRESSES

TECHNICAL FIELD

The present invention relates to a memory unit address transform definition system and a method of defining transforms. The present invention may be used, for example, for identification of address transformation from a logical address space into a topological address space in solid state memory devices, including semiconductor, ferro-electric, optical, holographic, molecular and crystalline atomic memories.

The present invention is applicable in particular, though not exclusively, in test systems for engineering test analysis, for example, for processing and representation of defect data, or in memory redundancy allocation systems for establishing a relationship between memory unit addresses in different memory device topologies for the purposes of distribution of spare resources.

BACKGROUND OF THE INVENTION

In the memory industry, large electronic systems are produced having hundreds of integrated circuits designed to implement a large number of logical functions. These functions are implemented by the logical design of the system. However, the actual physical structure of the system which specifies the actual physical locations of the electronic components necessary to implement the logical, i.e. electrical, functions, differs from the logical design.

At present, the size and density of memory products is increasing exponentially over time: from $2^{10}$ bits in 1971 to more than $2^{28}$ bits being sampled by manufacturers today. As the density of memory devices increases, the number of defects in them increases as well. To properly test a memory device, a detailed description of the internal topology and address mapping of the device is required in order to run complex redundancy schemes and optimize testing procedures.

To test memory products after fabrication, different test methods are used, some of them being independent of the physical location of the memory cell, but most requiring knowledge of the placement of every cell. The address presented to the memory device is called the logical address; this may not be the same as the address used to access the physical memory cell or cells, which is called the topological address. (See A. J. van de Goor "Testing Semiconductor Memories: Theory and Practice", publ. by John Wiley & Sons, 1996, pp. 429–436).

The translation of logical addresses into topological addresses is called address transformation, mapping, or scrambling. When addresses are transformed, successive logical addresses may transform into non-successive topological addresses. One reason for this difference is that decoders are restricted in size in order to fit the topology of rows and columns of memory cells. A second reason is that, to maintain acceptable production yields, redundant cells are added during manufacture that can be used to replace faulty cells. Spare rows and columns cause a difference in the logical and topological address sequence. Lastly, different device designs result in device layouts in which on-device address pads do not correspond to the standard pin numbers.

There are several transformation procedures described in An Interactive Descrambler Program for RAMs with Redundancy, Kirschner, N. In *Proc. IEEE Int. Test Conference*, pp. 252–257, 1982. The known transformation means can scramble the address lines of a 64 Kbit memory device using an 8-bit row address and an 8-bit column address. The equations describing the transformation operation for the row-select lines $r_0$ through $r_7$ are given below. To identify the mapping, each address must be calculated in accordance with the equations; there is no simple scheme provided for identifying the transformation.

$r_0 = a_0 \, XOR \, a_2 \, XOR \, A_7$ $r_1 = a_1 \, XOR \, a_2 \, XOR \, A_7$ $r_2 = a_2 \, XOR \, A_7$ $r_6 = a_6 \, XOR \, a_7$ $r_7 = a_7$

Using formulas for describing address transformation requires a tremendous amount of calculation and, taking into account the trend of continuously increasing numbers of units to be addressed in a memory, known procedures are becoming too bulky to enable fast and intelligent mapping from logical into topological space and reverse mapping. Moreover, these procedures cannot provide identification of mapping schemes in cases where formulas are unknown or the memory architecture is too complex to make possible fast and effective calculations.

There are numerous mapping schemes described in the literature where transformation tables are used. For example, U.S. Pat. No. 4,774,652 describes a memory mapping scheme designed to simplify the access of pages in a cache memory system. However, these systems often make mapping definition very difficult, for example requiring a lot of routine machine work to create a large table with $2^n$ entries. Storing the address transformation table requires too much space. Besides, reverse transformation requires the same memory space as direct transformation and is not possible where the available memory is restricted.

A computer design system for mapping a logical hierarchy into a physical hierarchy has been proposed in U.S. Pat. No. 5,455,775. The logical hierarchy contains several levels of logical entities connected by signals. The mapping is accomplished by physically allocating each of the logical entities to a specific physical component and storing lists of these logical entities and signal classifications. The known system simplifies mapping in that it permits the automatic generation of physical designs for an electronic layout and does not require the creation of large transformation tables. However, this technique cannot be used for reverse mapping, nor for defining the mapping where the transformation formulas are unknown.

Moreover, in some applications it is desirable to display an enlarged view of the die containing the semiconductor device and the locations that produced error data (see U.S. Pat. No. 5,720,031). Typically, complex algorithms are required to perform logical-to-physical and then physical-to-spatial mapping in order to display error data properly.

A simple mapping means and procedure has been proposed in PCT/RU98/00403, filed Nov. 30, 1998 (priority UK 9725066.6), published Jul. 22, 1999, WO 99/37083. The known means are capable of a configurable mapping represented as an affine transformation in $P^n$ space, where n is the total number of bits in an address, and P is the modulo 2 field. The transformation map is stored as an n×n matrix of bits and an n×1 translation vector. The known means permits direct and reverse mapping and provides a fast and cost-effective mapping procedure. To perform address transformation, the known means also uses transformation formulas.

However, in some applications transformation formulas are unknown, for example, when they are not given explicitly by the memory manufacturer. Such instances produce represents serious problems during testing or incoming inspection by the end user or buyer.

Thus, the problem of defining transformation remains when the transformation formulas are unknown.

SUMMARY OF THE INVENTION

It is an object of the present invention to overcome at least one of the above drawbacks of the prior art and provide a user-friendly means capable of fast and easy identification of address transformation of memory unit addresses between different memory device topologies when transformation formulas are unknown and a method for defining transforms memory device addresses, with the advantages of reducing the required memory space and the time required for transformation.

According to one aspect of the invention, a transform definition system is provided for the identification of transformations of memory device addresses between different memory device topologies, each topology having a corresponding address space, the system comprising:

a receiving means for receiving a representative plurality of pairs of addresses, each pair consisting of one memory cell address in the first address space and one address in the second address space;

an address pairs storage means for storing said pairs of addresses; and a computing means for computing the transformation formulas.

Preferably, the system according to the present invention further comprises a means for collecting and storing information about transformation, i.e. the transformation map, as an n×n matrix of bits and an n×1 translation vector, where n is the total number of bits in an address.

The transformation formulas obtained according to the present invention may be used in any affine transformation means for address transformation, preferably, in an affine transformation means capable of representing mapping as an affine transformation in $P^n$ space, where n denotes the total number of bits in an address, and P is the modulo 2 field, which is described in PCT/RU98/00403.

Still another aspect of the present invention is a method of defining transforms of memory device addresses between different memory device topologies, each topology having a corresponding address space, including;

receiving a representative plurality of pairs of addresses, each pair consisting of one memory cell address in the first address space and one address in the second address space, storing said pairs, and computing the transformation formulas.

Preferably, the method further comprises initializing affine transformation means using the obtained transformation formulas.

The proposed method of defining transforms may also be computer-implemented permitting fast and extremely easy address identification without the necessity of performing complex intellectual work and routine machine calculations.

According to the invention, a computer program product comprises:

a computer usable medium having computer readable program code means embodied in said medium for defining transforms of memory device addresses between different memory device topologies, each topology having a corresponding address space, said computer readable program code means comprising:

a computer readable program code means for causing a computer to receive a representative plurality of pairs of addresses, each pair consisting of one memory cell address in the first address space and one address in the second address space;

a computer readable program code means for causing a computer to store said pairs; and a computer readable program code means for causing a computer to generate transformation formulas.

Preferably, the proposed computer program product further comprises a computer readable program code means for causing a computer to transfer the transformation formulas to initialise an affine transformation means.

Still another aspect of the present invention is a computer readable memory operable in a computer, comprising a computer program for performing the above mentioned computer implemented method.

According to the invention, a system and a method for defining transforms may be used for different address transformations, for example, from logical into topological address space for engineering purposes, from logical into an address space appropriate for the purposes of allocating spare resources and laser repair procedures, or into an address space suitable for displaying errors stored in the form of a fault bit map, the transformation being a configurable mapping represented as an affine transformation.

It shall also be mentioned that an important feature of the present invention is that it is applicable for the identification of transformations independently of its direction, thereby providing identification of both direct and reverse transforms within the same procedure.

The term "a memory cell" as used herein is an example of a memory addressable unit and shall not be interpreted as a limiting feature. In general, any addressable memory device falls within the scope of the present invention and may be treated in accordance with the proposed procedures, including a memory tile, memory cell, or any other addressable unit within the memory device.

The terms "a transform definition system", or "a system for defining transforms" are used herein to denote a system capable of defining, or identifying, transforms, i.e. transformations, of memory device addresses between different memory device topologies.

The proposed system may also comprise a means for collecting and storing information about transformations in the form of a transformation map. The transformation map may be stored as an n×n matrix of elements (e.g., bits) and an n×1 translation vector, where n is the total number of bits in an address.

For a better understanding of the present invention and to show how the same may be carried into effect, reference will now be made, by way of example, without loss of generality, to the accompanying drawings in which:

DETAILED DESCRIPTION OF THE INVENTION

Figure 1:
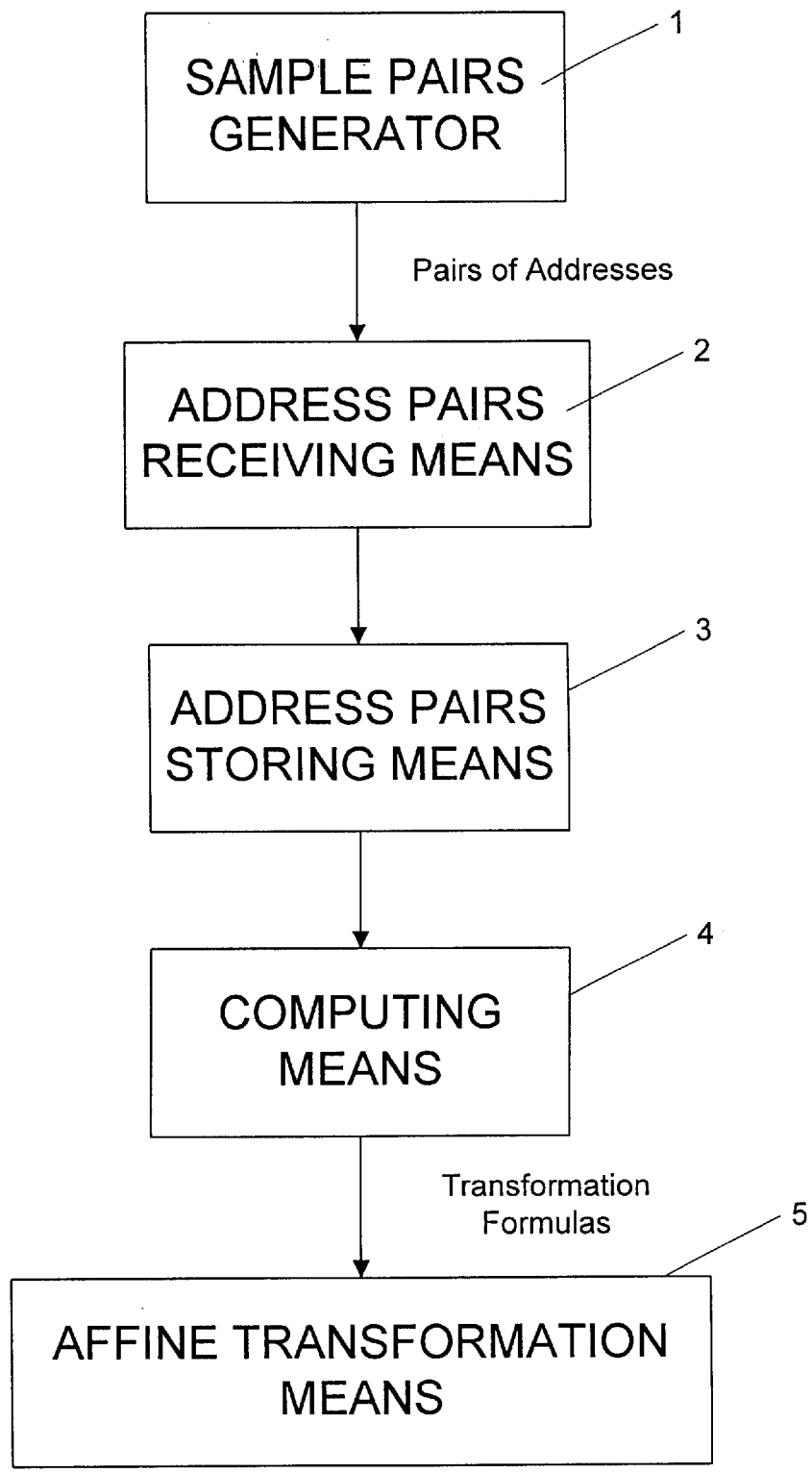
FIG. 1 is a block scheme of the means for defining transforms in accordance with the present invention.

As shown in FIG. 1, the proposed transform definition system comprises a sample pairs generator 1 for generating pairs of addresses, each pair comprising one address from the logical, i.e. electrical, address space, including a row address, column address, and DQ address, and one address from, for example, the topological (physical) address space. The total size of a topological address is defined by the sum of a column address size, row address size and, possibly, DQ address size. The sample pairs generator 1 is operated by the user and may be implemented in a computer interface. An address pairs receiving means 2 receives information about the memory device expressed in the form of pairs of addresses which are stored in an address pairs storing means 3. These pairs are sequentially fed into a computing means 4 for computing transformation formulas. The defined transformation formulas then may be transferred to initialize the affine transformation means 5 representing mapping between these two address spaces. Any suitable affine transformation means, for example the means described in PCT/RU98/00403, may be used for representing mapping.

Figure 2:
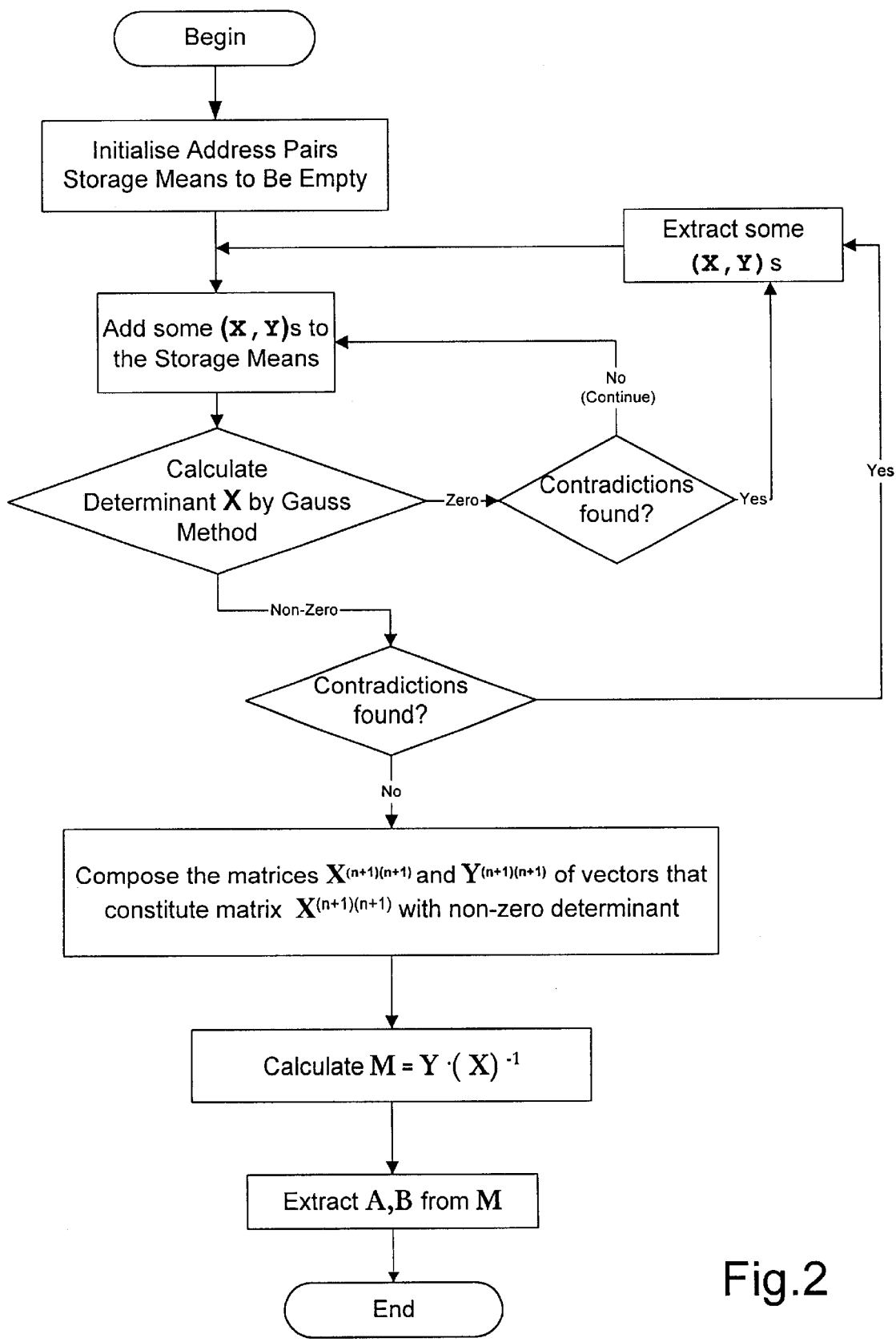
FIG. 2 shows an example flow chart of the method for defining transforms in accordance with the present invention.

The flow chart of the method of defining transforms in accordance with the present invention is shown in FIG. 2. The size of each address vector is distributed between vector components, i.e. column, row and DQ components. Where the DQ coordinate is absent from the address, the total address size will be constituted by a column address size and row address size only. The transformation identification means starts to operate upon receipt of the following information in bit form about the memory device: a) the address of the first memory unit in the first address space, comprising row address, R1, column address, C1, and, possibly, DQ address, and b) any address in the second address space, comprising row address, R2, column address, C2, and, possibly, DQ address. On the basis of this information, the transform definition means combines bits of row addresses into a bit vector X and bits of column addresses into a bit vector Y.

Transformation formulas in the case of affine address transformation may be represented in general by the linear function shown in FIG. 3(a):

$Y=AX+B$, where X is a vector combined of bits of row, column and, possibly, DQ addresses of a memory unit in the first address space, Y is a vector combined of bits of row, column and, possibly, DQ addresses of a memory unit in the second address space, A is a mapping matrix to be identified, the matrix containing n×n elements of P (where P is the modulo 2 field), and B is a translation vector, n×1 bits, to be identified. Conventionally, mapping matrices and translation vectors are obtained by calculations from formulas supplied by the manufacturer. Thus, to calculate, e.g. the physical address of a cell, both the logical address and the mapping formulas are needed. However, if formulas are unknown, or a device architecture is too complex, the prior art methods cannot be used and the problem remains unresolved.

Figure 3:
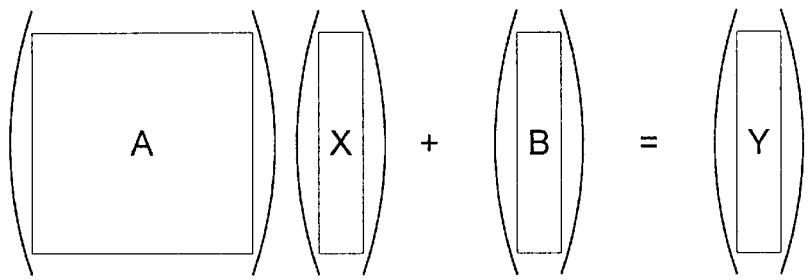
FIG. 3 illustrates an example procedure of defining transformation formulas.
Figure 3:
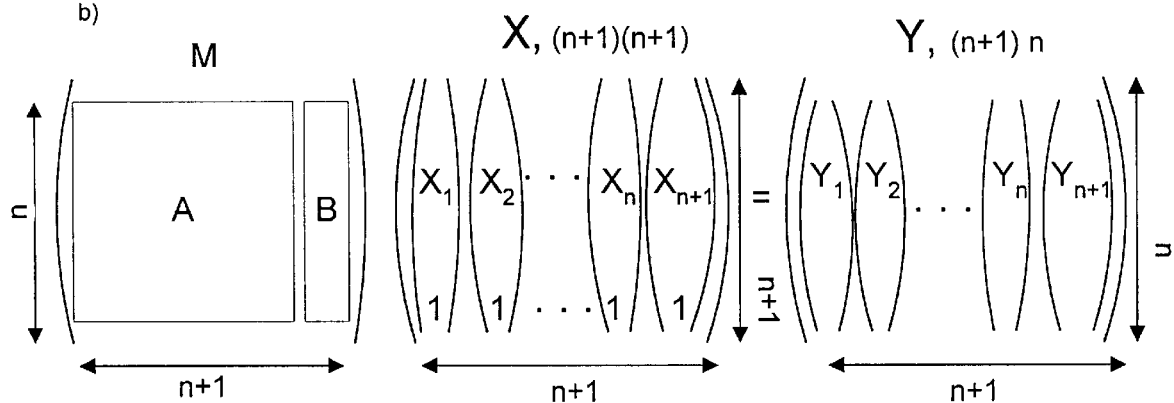
Figure 3:
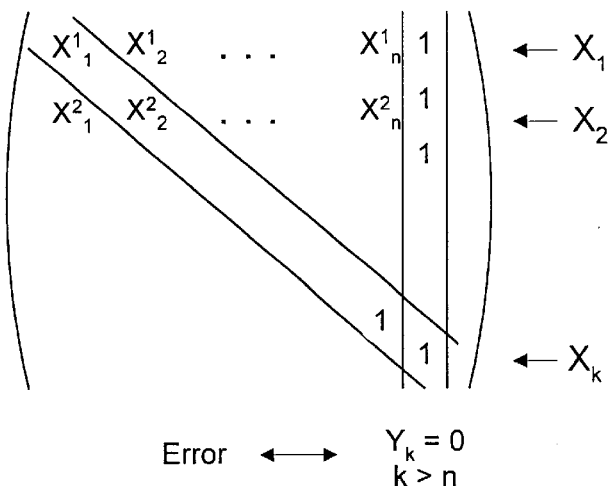

An example of the transform definition procedure in accordance with the proposed invention will now be explained in detail and illustrated in FIGS. 2 and 3.

The first step of the proposed procedure is taking at random a pair of addresses, one address, X1, being from the first address space and the other address, Y1, being from the second address space, and placing the address X1 in the corresponding matrix X, and the address Y1 in the corresponding matrix Y. Then, the next pairs of addresses X2 and Y2, X3 and Y3, . . . , Xn+1 and Yn+1, are taken sequentially and arranged in the corresponding matrixes X,Y. To simplify the calculations and increase the speed of processing, the above formulas are represented as shown in FIG. 3(b), i.e. at the bottom of each X vector a "1" is added, whereas a matrix M is composed out of matrix A and translation vector B.

After each pair of X,Y has been added, the determinant of matrix X is calculated and the next pair of X,Y addresses is added until a non-zero determinant of matrix X is obtained.

If the determinant of matrix X is Zero, the transformation may be unidentifiable. In this case, some pairs of X,Y are extracted, and the determinant is calculated until non-zero determinant is achieved.

The next step is reordering columns of matrix X so that the upper lines of matrix X give a non-zero determinant. After the calculations are performed, the error is checked to make the procedure time- and memory-effective, as shown in FIG. 3. To provide this, each pair of addresses X, Y is checked to ensure it is non-contradictory, i.e. if Y is O, then X should be zero too.

Once the non-zero determinant is achieved, the matrix A and the transformation vector B may be easily extracted and the transformation completely defined as follows:

$M=Y \cdot X^{-1}$, the X being invertible.

Where matrix X is uininvertible, the procedure is continued until a non-zero determinant is achieved.

A computer program for implementing functions of the above system and/or performing the above method of transform definition may be created in any suitable computer language, e.g. C, C++, any Assembler, etc. in a manner evident for a person skilled in the art.

It will be appreciated that the above is an example embodiment only and that various modifications may be made to the embodiment described above within the scope of the present invention.

What is claimed:

1. A system for defining transforms of memory device addresses between different memory device topologies, each topology having a corresponding address space, the system comprising a receiving means for receiving a representative plurality of pairs of addresses, each pair consisting of one memory cell address in the first address space and one address in the second address space, an address pairs storing means for storing said pairs of addresses, a computing means for computing transformation formulas.

2. A system according to claim 1, wherein the address spaces are selected from the group including logical address space, topological address space, redundancy allocation address space, spatial address space or any other memory device address space.

3. A system according to claim 1, further comprising a transformation map storing means for storing a transformation map as an n×n matrix of bits and a n×1 translation vector, where n is the total number of bits in an addresses.

4. A system according to claim 1, further comprising a means for initialization of an address transformation means.

5. A system according to claim 4, wherein the address transformation means are capable of representing mapping as an affine transformation in $P^n$ space, where n denotes the total number of bits in an address, and P is the modulo 2 field.

6. A method of defining transforms of memory device addresses between different memory device topologies, each topology having a corresponding address space, the method including:
> a step of receiving a representative plurality of pairs of addresses, each pair consisting of one memory cell address in the first address space and one address in the second address space,
> a step of storing said pairs,
> a step of computing transformation formulas.

7. A method of defining transforms according to claim 6, further comprising a step of transferring the transformation formulas to initialize an affine transformation means.

8. A method according to claim 6, wherein the transformation formulas are transferred to an address transformation means capable of representing mapping as an affine transformation in $P^n$ space, where n denotes the total number of bits in an address, and P is the modulo 2 field.

9. A computer program product comprising a computer usable medium having computer readable program code means embodied in said medium for defining transforms of memory device addresses between different memory device topologies, each topology having a corresponding address space, said computer readable program code means comprising:
> a computer readable program code means for causing a computer to receive a representative plurality of pairs of addresses, each pair consisting of one memory cell address in the first address space and one address in the second address space,
> a computer readable program code means for causing a computer to store said pairs,
> a computer readable program code means for causing a computer to generate transformation formulas,
> a computer readable program code means for causing a computer to transfer the transformation formulas to initialize an affine transformation means.

10. A computer program product according to claim 9, further comprising a computer readable program code means for causing a computer to store the transformation map as an n×n matrix of bits and an n×1 translation vector, where n is the total number of bits in an address.

11. A computer program product according to claim 9, wherein a computer readable program code means for causing a computer to generate transformation formulas comprises:
> a computer readable program code means for causing a computer to sequentially receive said pairs of addresses and place one address from each pair in a matrix X corresponding to the first address space, and the other address in a matrix Y corresponding to the second address space,
> a computer readable program code means for causing a computer to calculate a determinant for the matrix X corresponding to the first address space after each pair of addresses is added;
> a computer readable program code means for causing a computer to extract some pairs of addresses and/or add some pairs of addresses until a non-zero determinant for the matrix X corresponding to the first address space is obtained;
> a computer readable program code means for causing a computer to calculate matrix M as $Y \cdot X^{-1}$ and extract a transformation matrix and a transformation vector out of the matrix M.

12. A system according to claim 1, wherein in the receiving means for receiving a representative plurality of pairs of addresses, each pair of addresses consists of one memory cell address Xi, where Xi is a vector combined of n bits of row and column addresses of a memory unit in the first address space, and one address Yi, where Yi is a vector combined of n bits of row and column addresses of a memory unit in the second address space.

13. A system according to claim 12, wherein Xi is a vector combined of n bits of row, column, and DQ addresses of a memory unit in the first address space, and Yi is a vector combined of n bits of row, column, and DQ addresses of a memory unit in the second address space.

14. A system according to claim 1, wherein the address pairs storing means store said pairs of addresses in a matrix form, wherein each address Xi of the pair of addresses is placed in a matrix X, and each address Yi of the pair of addresses is placed in a matrix Y, so that all the addresses Xi, Yi are arranged in the corresponding matrixes X, Y in such a way that a bit containing a value 1 is added to the bottom of each Xi vector, thereby matrix X is (n+1)×(n+1) matrix, whereas Y is (n+1)×n matrix.

15. A system according to claim 1, wherein the computing means computes transformation formulas by multiplying matrix Y by inverted matrix X and extracting from the product matrix M which is a (n+1)•n matrix defined as M=Y×(X)$^{-1}$ a transformation matrix A as the left n vectors os matrix M, and a translation vector B as the (n+1)$^{th}$ vector of matrix M, the addresses from one address space into another.

* * * * *